United States Patent
Hsu et al.

(10) Patent No.: US 8,450,052 B2
(45) Date of Patent: May 28, 2013

(54) DOUBLE PATTERNING STRATEGY FOR CONTACT HOLE AND TRENCH IN PHOTOLITHOGRAPHY

(75) Inventors: Feng-Cheng Hsu, Sanxia (TW); Jian-Hong Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/274,840

(22) Filed: Oct. 17, 2011

(65) Prior Publication Data

US 2012/0034778 A1    Feb. 9, 2012

Related U.S. Application Data

(63) Continuation of application No. 12/047,086, filed on Mar. 12, 2008, now Pat. No. 8,048,616.

(51) Int. Cl.
*G03F 7/26* (2006.01)

(52) U.S. Cl.
USPC .......................................... 430/323; 430/394

(58) Field of Classification Search
USPC .......................................... 430/311, 313, 315
See application file for complete search history.

(56) References Cited

U.S. PATENT DOCUMENTS

| 5,667,940 A | 9/1997 | Hsue et al. |
| 6,221,562 B1 | 4/2001 | Boyd et al. |
| 7,935,477 B2 | 5/2011 | Hsu et al. |
| 2008/0064213 A1 * | 3/2008 | Jung .............................. 438/696 |

FOREIGN PATENT DOCUMENTS

| JP | 2001-251038 | 9/2001 |
| TW | 200707083 | 2/2007 |

* cited by examiner

*Primary Examiner* — Kathleen Duda
(74) *Attorney, Agent, or Firm* — Haynes and Boone, LLP

(57) ABSTRACT

A method of lithography patterning includes forming a first resist pattern on a substrate, the first resist pattern including a plurality of openings therein on the substrate; forming a second resist pattern on the substrate and within the plurality of openings of the first resist pattern, the second resist pattern including at least one opening therein on the substrate; and removing the first resist pattern to uncover the substrate underlying the first resist pattern.

20 Claims, 4 Drawing Sheets

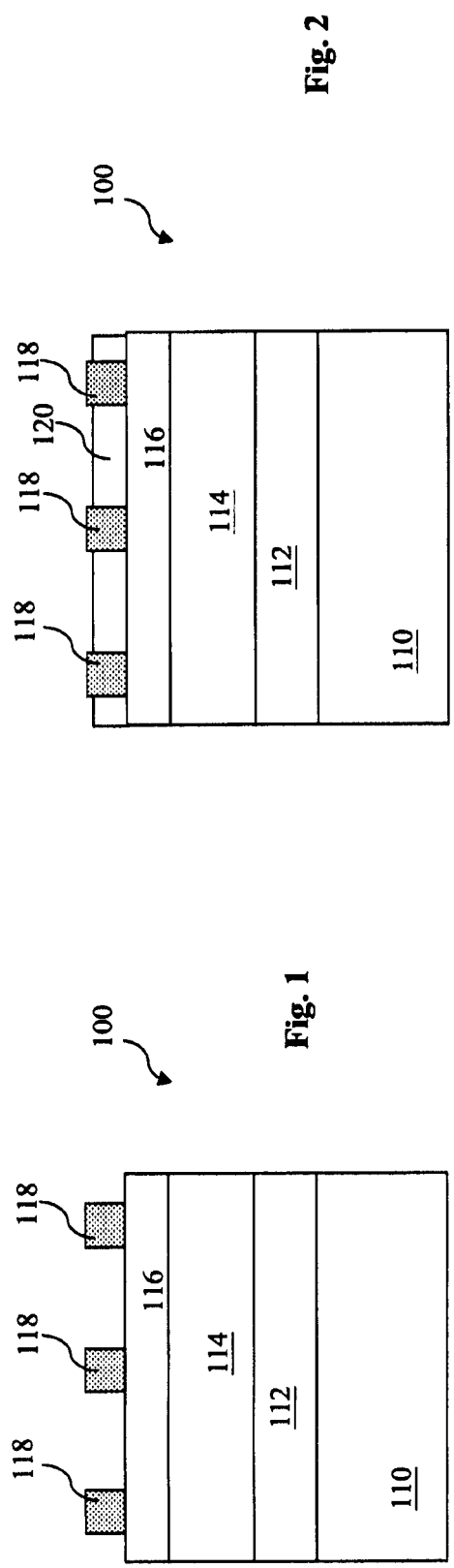
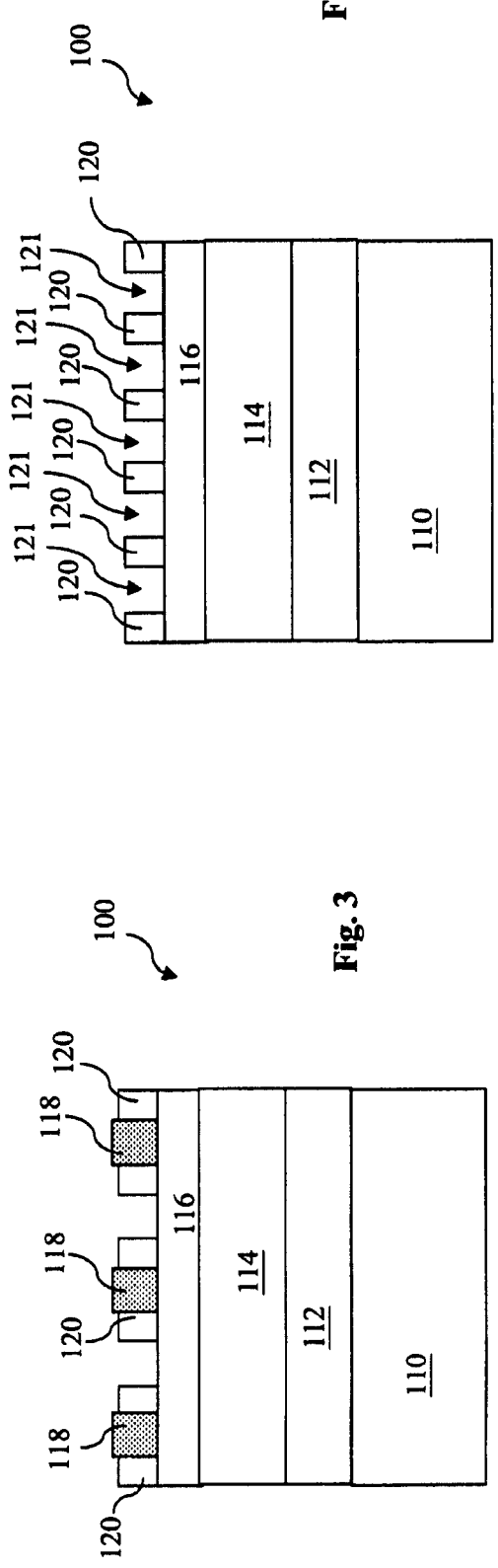

DOUBLE PATTERNING STRATEGY FOR CONTACT HOLE AND TRENCH IN PHOTOLITHOGRAPHY

CROSS REFERENCE

This application claims priority to and is a continuation of U.S. patent application Ser. No. 12/047,086 filed on Mar. 12, 2008, the entire disclosure of which is incorporated herein by reference. The present disclosure is related to the following commonly-assigned U.S. patent applications, the entire disclosures of which are incorporated herein by reference: U.S. application Ser. No. 11/948,444 filed Nov. 30, 2007 by inventors Feng-Cheng Hsu and Chun-Kuang Chen for "DOUBLE PATTERNING STRATEGY FOR CONTACT HOLE AND TRENCH IN PHOTOLITHOGRAPHY".

BACKGROUND

Semiconductor technologies are continually progressing to smaller feature sizes, for example down to feature sizes of 65 nanometers, 45 nanometers, and below. A patterned photoresist (resist) layer used to produce such small feature sizes typically has a high aspect ratio. Maintaining a desired critical dimension (CD) can be very difficult for various reasons, especially for a resist layer with a high aspect ratio. The double patterning process is introduced to form various features with smaller dimensions. However, the conventional double patterning process involves multiple etching processes with high manufacturing cost and low throughput.

BRIEF DESCRIPTION OF THE DRAWINGS

Aspects of the present disclosure are best understood from the following detailed description when read in association with the accompanying figures. It is noted that, in accordance with the standard practice in the industry, various features in the drawings are not drawn to scale. In fact, the dimensions of illustrated features may be arbitrarily increased or decreased for clarity of discussion.

FIGS. 1 through 8 are sectional views of one embodiment of a semiconductor device during various fabrication stages.

DETAILED DESCRIPTION

Figure 5:

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 7:
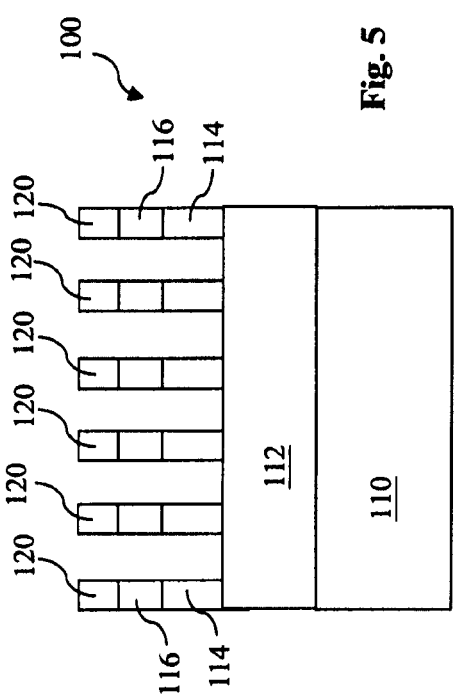
Figure 8:
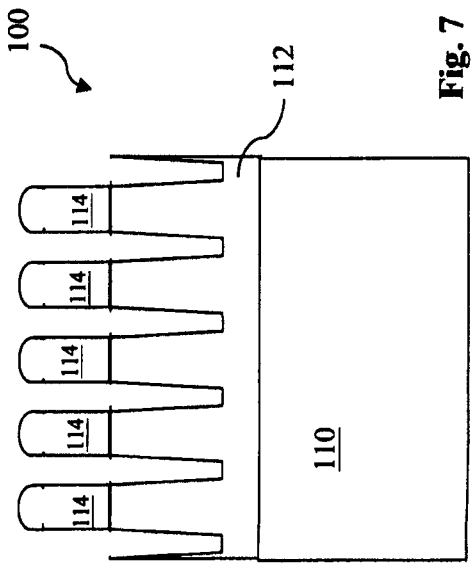
Figure 9:
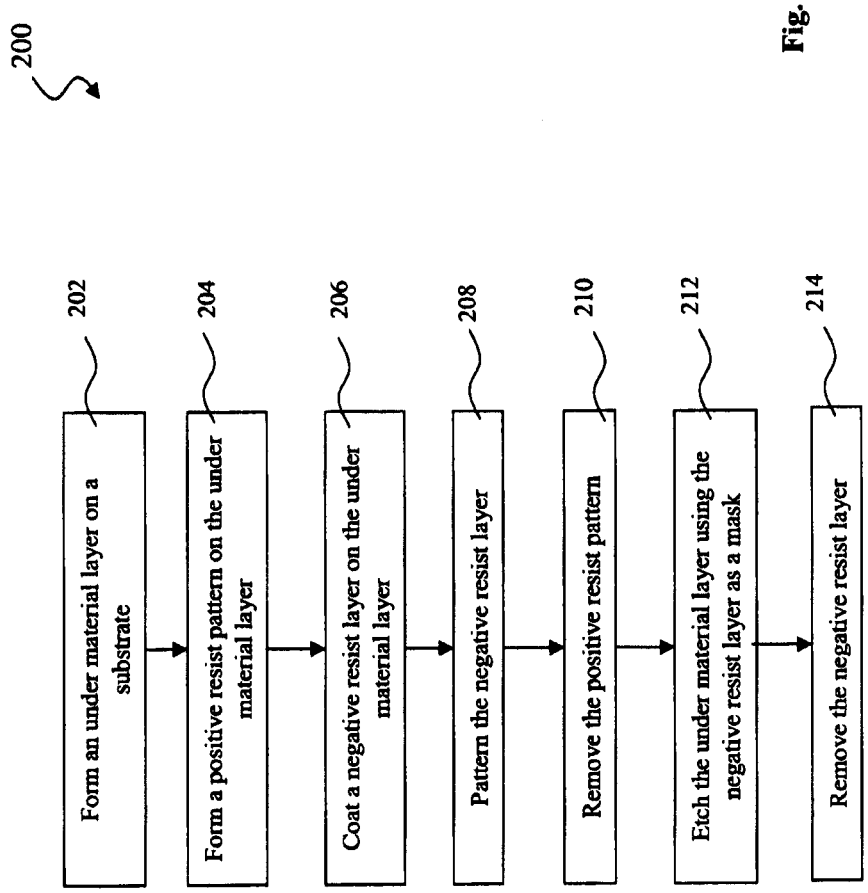
FIG. 9 is a flowchart showing one embodiment of a lithography patterning method.

FIGS. 1-8 are sectional views showing one embodiment of an integrated circuit device (semiconductor device) 100 during various fabrication stages. FIG. 9 is a flowchart of one embodiment of a lithography patterning method 200. With reference to FIGS. 1-9, the method 200 for lithography patterning is described.

Referring to FIGS. 1 and 9, the method 200 may begin at step 202 by forming one or more underlying material layer (also referred to as an "under material" layer) on the substrate 110. The substrate 110 includes silicon. The substrate 110 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Alternatively, the substrate 110 may include a non-semiconductor material such as a glass substrate for thin-film-transistor liquid crystal display (TFT-LCD) devices, or fused quartz or calcium fluoride for a photomask (mask). The substrate 110 may include various doped regions, dielectric features, and multilevel interconnects. In one embodiment, the substrate 110 includes various doped features for various microelectronic components, such as a complementary metal-oxide-semiconductor field-effect transistor (CMOSFET), imaging sensor, memory cell, and/or capacitive element. In another embodiment, the substrate 110 includes conductive material features and dielectric material features configured for coupling and isolating various microelectronic components, respectively. In another embodiment, the substrate 110 include one or more material layers formed thereon.

The under material layer may include multiple films for different functions in various applications. In one embodiment, a material layer 112 is formed on the substrate 110. The material layer 112 includes a dielectric material. In one example, the material layer 112 includes silicon oxide and/or low dielectric-constant (low-k) material. In other examples, the material layer 112 may include silicon, poly-silicon, dielectric material, conductive material or combinations thereof. The material layer 112 may have a thickness ranging between about 100 angstroms and about 9000 angstroms. In one example, the material layer 112 has a thickness ranging between about 1000 angstroms and 3500 angstroms. In one embodiment, the material layer 112 includes a dielectric material for interlayer dielectric (ILD) or inter-metal dielectric (IMD). The dielectric material includes silicon oxide and/or low-k dielectric material with a dielectric constant being less than about 4. For examples, the low-k dielectric material may be fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other proper porous polymeric materials. The dielectric material may be formed by a suitable process including spin-on coating or chemical vapor deposition (CVD).

A mask layer 114 may be additionally formed on the material layer 112. In the present embodiment, the mask layer 114 includes silicon nitride, silicon oxynitride, or other suitable material film formed by a suitable process, such as CVD deposition. As an example, the precursor used to form a silicon nitride material layer in CVD deposition includes Hexachlorodisilane (HCD) $Si_2Cl_6$; Dichlorosilane (DCS) $SiH_2Cl_2$; Bis(TertiaryButylAmino)Silane (BTBAS) $C_8H_{22}N_2Si$; and Disilane (DS) $Si_2H_6$. The mask layer 114 may have a thickness ranging between about 50 angstroms and about 1000 angstroms. The mask layer 114 can function as a hard mask during a later etching process for patterning the material layer 112 and/or the substrate 110.

Additionally, a material layer 116 may be formed on the mask layer 114 to reduce reflection during lithography exposing processes, also referred to as an anti-reflective coating (ARC) layer or bottom anti-reflective coating (BARC) layer. In one example, the BARC layer may include organic BARC material formed by a spin-coating technique. The material layer 116 may have a thickness ranging from about 50 angstroms to about 2000 angstroms. The BARC layer 116 may be eliminated such that the mask layer 114 functions as a mask and an anti-reflective coating layer. In various embodiments, different combinations of the provided material layers or a subset thereof may be used as the under material layer in various applications.

Still referring to FIGS. 1 and 9, the method proceeds to step 204 by forming a positive tone resist (positive resist) pattern 118 on the semiconductor device 100. The positive resist is characterized as that the exposed regions will be gone. As one example of the formation, a positive resist layer is formed on the semiconductor device 100 and then patterned by a first lithography process to form the positive resist pattern 118 as illustrated in FIG. 1. The positive resist pattern 118 includes a plurality of positive resist features and a plurality of openings defined by the positive resist features, such that portions of the under material layer within the openings are uncovered. The first lithography process uses a lithography system and a first mask. The openings of the positive resist pattern 118 are formed according to a predetermined integrated circuit pattern in the first mask. In one embodiment, the positive resist features include a pitch, defined as a distance from one feature to adjacent feature of the first resist pattern. The pitch may range between about 50 nm and about 200 nm. As one example, the pitch is about 100 nm. The first resist pattern 118 may have a thickness ranging between about 500 angstroms and 5000 angstroms. In various examples, the first resist pattern 118 may have a thickness ranging between about 500 angstroms and 3000 angstroms, or between about 500 angstroms and 1500 angstroms. The first lithography process used to form the positive resist pattern 118 may include resist coating, exposing, post-exposure baking, and developing. In another embodiment, the first lithography process may additionally include soft baking, mask aligning, and/or hard baking. For illustration, the exposing process may be carried out by exposing the semiconductor device 100 under a radiation beam through the first mask.

Referring to FIGS. 2 and 9, the method 100 proceeds to step 206 by forming a negative resist layer 120 on the device 100. In one example, the negative resist layer 120 is formed on the under material layer overlying the substrate 110 and within the openings defined by the positive resist pattern 118. The negative resist layer 120 is coated on the device 100 such that the top surface of the negative resist layer 120 is lower than that of the positive resist pattern 118 and the positive resist pattern 118 is uncovered by the negative resist layer 120. In one embodiment, the negative resist to be coated is tuned with a higher surface tension so that the top surface of the negative resist layer is not formed on the top surface of the positive resist pattern 118. In another embodiment, the speed of the spin-on coating is tuned to a higher level such that the top surface of the positive resist pattern 118 is uncovered by the negative resist layer 120. In another embodiment, the negative resist layer 120 is chosen such that it is soluble in one solvent in which the positive resist pattern 118 is insoluble. For example, the negative resist layer is soluble in water, while the positive resist pattern is insoluble in water but soluble in organic solvent instead.

Referring to FIGS. 3 and 9, the method 200 proceeds to step 208 to pattern the negative resist layer 120 by a second lithography process. The negative resist layer 120 is patterned to form a negative resist pattern (also labeled with the numeral 120 to avoid confusion), having a plurality of negative resist features and a plurality of openings. In one example, the negative resist features are periodically configured and may have a pitch ranging between about 50 nm and about 200 nm. The under material layer within the openings are uncovered as the negative resist patterns are exposed. In one embodiment, each of the negative resist features is positioned to horizontally enclose one feature of the positive resist pattern. In a second lithography process, the negative resist layer 120 is exposed using a second mask with a second predefined pattern and a lithography system. The second lithography process may further include post-exposure baking, developing, and hard baking.

Referring to FIGS. 4 and 9, the method 200 proceeds to step 210 to remove the positive resist pattern 120. In one embodiment, a proper solvent may be chosen such that the positive resist is soluble in the solvent while the negative resist is insoluble in the solvent. Therefore, by applying the solvent, the positive resist pattern 118 is removed while the negative resist pattern remains. In one example, an organic solvent is applied to the semiconductor device 100 to selectively remove the positive resist pattern 118. In another example, the positive resist pattern 118 is intrinsically removed by the developing process implemented at step 208. In this example, the step 210 is eliminated and the removing the positive resist pattern 118 is achieved at step 208. Therefore, the removal of the positive resist pattern 118 and the patterning of the negative resist layer are completed in one step. After the removal of the positive resist pattern 118, various openings 121 are formed in the negative resist layer 120 as illustrated in FIG. 4. The openings 121 are collectively defined by the first mask and the second mask and formed in the various processes described above.

The negative resist pattern 120 is configured relative to the first resist pattern 118 so to utilize a double patterning structure. In one embodiment, the formed openings 121 in the negative resist patterns are configured to achieve pitch splitting. The pitch may be about 100 nm in one example. In another example, the positive and negative resist patterns 118 and 120 are configured to have a split pitch as half of the pitch of positive or negative resist pattern. The pitch defined by the openings 121 are halved, resulting in a reduced minimum features size. The openings 121 thus formed are used to further form various contact holes or trenches in different applications.

Referring to FIGS. 5 and 9, the method 200 proceeds to step 212 by etching the underlying material layer. The mask layer 114 within the openings 121 is uncovered by the negative resist layer 120 and is removed in the etching process, transferring the openings 121 defined in the negative resist layer 120 into the mask layer 114. The etching process is chosen such that the mask layer 114 has a higher etch rate than that of the negative resist layer 120. Therefore, the mask layer within the openings 121 is substantially removed during the etching process. In one example, the BARC layer 116 within the openings 121 is removed during the etching process at this step. In another example, the BARC layer 116 within the openings 121 is removed at step 210 by the solvent to remove the positive resist pattern 118.

Figure 6:
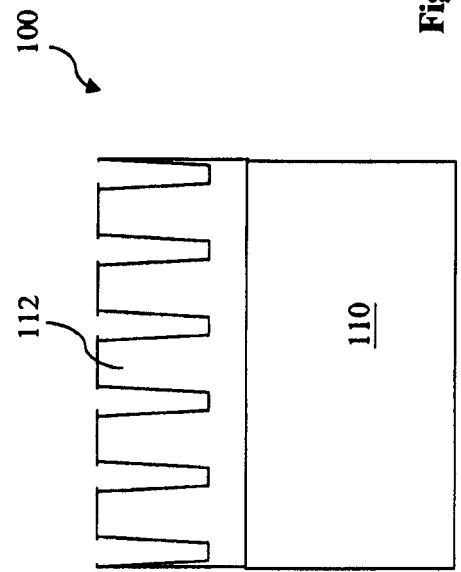

Referring to FIGS. 6 and 9, the method 200 may proceed to step 214 by removing the negative resist layer 122 after etching the underlying material layer within the openings 121 defined in the negative resist layer 120. The step 214 may implement a wet stripping or plasma ashing known in the art to remove the negative resist layer 120. For example, an oxygen plasma ashing may be implemented to remove the negative resist layer 120. Additionally, the BARC material layer 116 may also be simultaneously removed by the same plasma ashing process.

The dielectric layer 112 can be etched using the patterned mask layer 114 as a hard mask to transfer the defined openings from the mask layer 114 to the dielectric layer 112, as illustrated in FIG. 7 in a sectional view. The dielectric layer 112 is thus patterned to form a plurality of trenches or contact holes. The etching process includes a dry etch. The etching process may alternatively or additionally include a wet etch. The mask layer 114 is used as a hard mask at this step and therefore has a higher etching resistance relative to that of the dielectric layer 112. The dry etch may utilize a proper etch gas, such as $HBr$, $Cl_2$, $SF_6$, $O_2$, Ar, and/or He. The mask layer 114 could be partially consumed during the etching process. The remainder of the mask layer 114 is thereafter removed, as illustrated in FIG. 8.

The method described above with reference to FIGS. 1 to 9 provides a double patterning process constructed according to various aspects of the present disclosure. This method achieves double exposures and a single etching process to the underlying material layer or the substrate, therefore reducing the manufacturing cost and minimizing CD variation. Other advantages may further present in different embodiments and/or applications. As one example, the overlay error between the positive and negative resist patterns may cause two adjacent openings 121 to be repositioned. However, the dimensions of the openings 121 (corresponding to contact holes or trenches) are maintained by implementing the method 200. The dimensional changes of the IC features (such as contact holes or metal lines) associated with the overlay error of the existing double patterning process are eliminated. In another example, since only one etching process is used to etch the under material layer, the manufacturing cost is reduced. The manufacturing throughput and product quality are enhanced, compared with the conventional double patterning and double etching method. In another example, the method 200 is capable of etching a thicker film since the mask layer 114 can be properly chosen with a higher etch resistance.

Another embodiment (second embodiment) of the method 200 is described below with reference to FIGS. 9 through 13. The method 200 in this embodiment also begins at step 202 by forming an under material layer on a substrate 110 and proceeds to step 204 to form a positive resist pattern 118 on the under material layer, substantially similar to those steps in the first embodiment.

Figure 10:
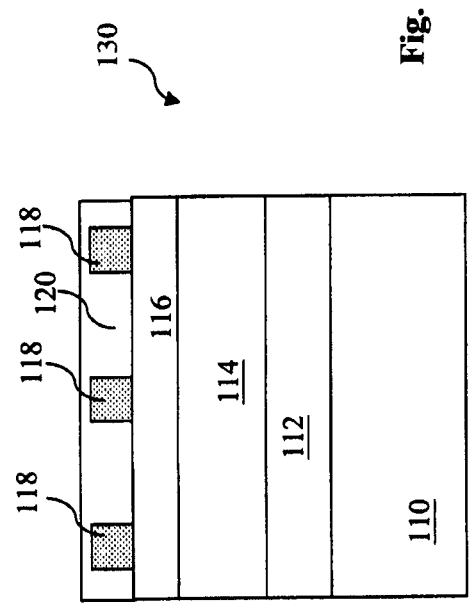

Referring to FIGS. 10 and 9, the method 200 proceeds to step 206 by forming a negative resist layer 120 on the substrate. In one example, the negative resist layer is formed on the under material layer overlying the substrate and additionally on the positive resist pattern 118 as illustrated in FIG. 10. The negative resist layer 120 formed on the under material layer has a thickness greater than that of the positive resist pattern 118 and therefore covers the positive resist layer 118 as well. In one example, the negative resist layer formed over the positive resist pattern 118 has a thickness ranging between about 50 angstroms and about 100 angstroms. A spin-on coating process is implemented to form the negative resist layer 120 on device 100 with a substantially flat surface. In one embodiment, the negative resist layer 120 and the positive resist pattern are chosen such that the positive resist has an etching resistance lower than that of the negative resist layer in an etchant to be used at step 210. In one embodiment, the positive resist pattern 118 includes chemical amplifier (CA) resist. The CA resist includes photoacid generator (PAG) that can be decomposed to form acid during a lithography exposure process. More acid can be generated as a result of catalytic reaction. In furtherance of the embodiment, the negative resist is properly chosen to be inert to the released photogenerated acid from the positive resist pattern.

Figure 11:
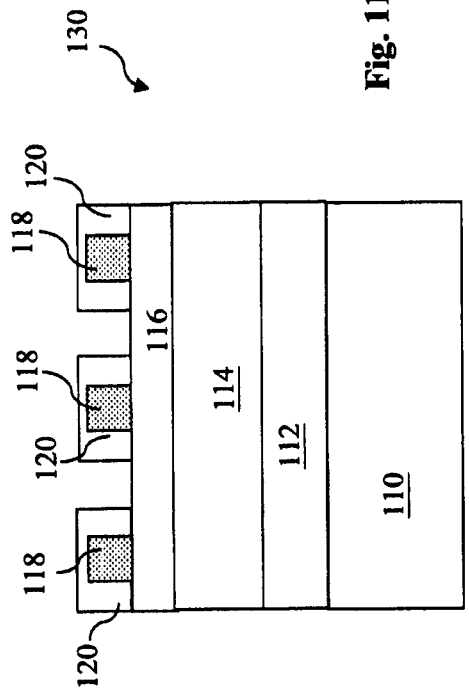
FIGS. 10 through 13 are sectional views of another embodiment of a semiconductor device during various fabrication stages.
Figure 13:
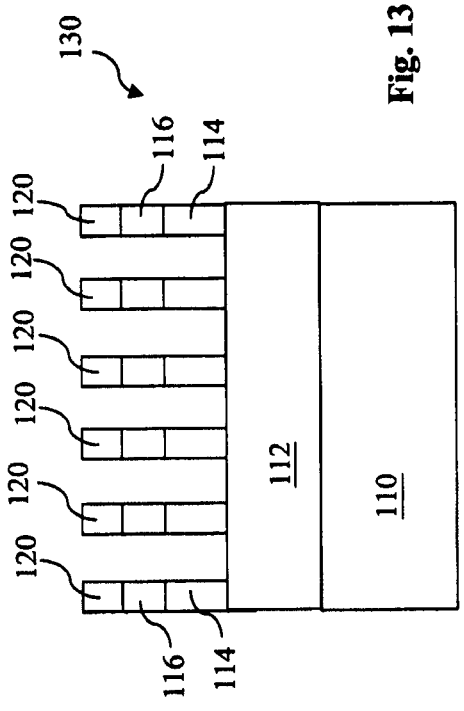

Referring to FIGS. 11 and 9, the method 200 proceeds to step 208 to pattern the negative resist layer 120 by a second lithography process. The negative resist layer 120 is patterned to form a negative resist pattern having a plurality of negative resist features. The negative resist pattern 120 also includes a plurality of openings in which the under material layer are uncovered. The negative resist layer 120 is optically exposed using a second mask and a lithography system. The second lithography process may further include post-exposure baking, developing, and hard baking.

Figure 12:
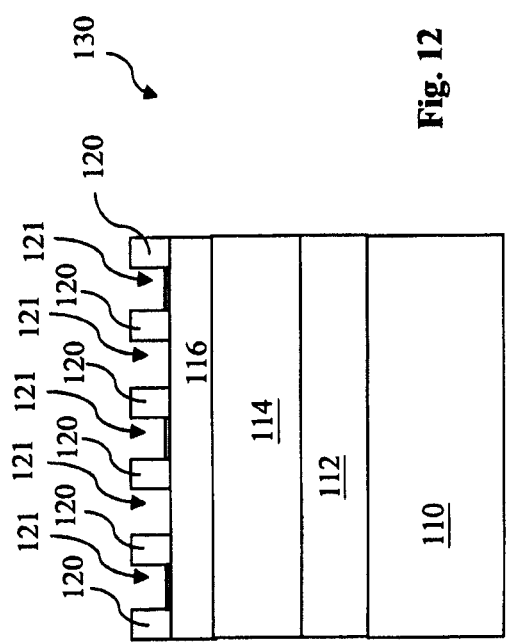

Referring to FIGS. 12 and 9, the method 200 proceeds to step 210 to remove the positive resist pattern 120. An etchant is applied to the device 100 in an etching process. The etchant has distinct etching resistances between the positive resist material and the negative resist material. In one example, the negative resist has an etching resistance to the etchant higher than that of the positive resist. Therefore, by performing the etching process, the positive resist pattern 118 is substantially removed while the negative resist pattern 120 substantially remains. In one example, an organic etchant is applied to the semiconductor device 100 to selectively remove the positive resist pattern 118. In one example, the BARC layer within the openings of the negative resist pattern 120 is partially or completely removed by the etching process. After the removal of the positive resist pattern 118, various openings 121 are defined in the negative resist layer 120 as illustrated in FIG. 12. The openings 121 are formed in the negative resist pattern according to the patterns of the first and second masks and are designed to form contact holes or trenches in various embodiments.

The method 200 in the second embodiment, after the formation of the openings 121 in the negative resist layer, may further include other processing steps described in the first embodiment. For example, the method 200 further includes steps 212 to etch the mask layer 114 shown in FIG. 13, which is substantially similar to step 212 in the first embodiment. The method 200 may also include step 214 to remove the negative resist layer 120 as illustrated in FIG. 6, which is substantially similar to step 214 described in the first embodiment. In other examples, the method 200 may further include etching the dielectric layer 112 under the mask layer 114 and removing the mask layer thereafter.

Various embodiments of a lithography patterning method 200 have been introduced and described. Other modifications, variations, additions, and extensions may be used without departing from the scope of the disclosure. In one example, a plurality of contact holes are defined by the positive and negative resist patterns and are formed in the dielectric layer 112. Alternatively, a plurality of trenches may be defined by the positive and negative resist patterns and formed in the dielectric layer 112. In another example, the BARC layer and/or mask layer may be eliminated. In another example, the positive and negative resist patterns are directly formed on the substrate 110.

The radiation beam may be ultraviolet (UV) or EUV, such as a 248 nm beam from a Krypton Fluoride (KrF) excimer laser, or a 193 nm beam from an Argon Fluoride (ArF) excimer laser. The lithography process may utilize other exposing modes or technologies, such as on-axis, off-axis, quadripole, or dipole exposure technologies. The optical exposing process may alternatively be implemented or replaced by other proper methods such as maskless lithography, electron-beam writing, ion-beam writing, and molecular imprint techniques. In another example, the first and second masks used in the method 200 may utilize other mask technologies. For example, the first pattern (or second mask pattern) may be formed in a phase shift mask (PSM). The phase shift mask can print better images than a binary mask.

In one embodiment, the positive resist pattern includes chemical amplifier (CA) resist. In another embodiment, the negative resist layer includes negative resist inert to acid. In furtherance of the embodiment, the negative resist layer includes cyclized synthetic rubber resin, bis-acrylazide, and aromatic solvent. In another embodiment, the positive resist may alternatively include novolac resin, diazonaphthoquinone (DNQ) as photoacitve compound (PAC), and PGME (or PGMEA or ethyl lactate) as solvent. In another example, the negative resist includes silicon-containing material such that the negative resist has an etching resistance greater than that of the positive resist.

As noted earlier in one embodiment, the removing process of the positive resist pattern at step 210 may be combined with the step 208. For example, the developing solution used to develop the negative resist layer can be tuned or designed to simultaneously remove the positive resist pattern.

In another example, the method 200 includes a resist curing (or resist freezing) process applied to the positive resist pattern 118 before the formation of the negative resist layer 120. The curing process is designed to harden the positive resist pattern 118 and prevent it from being deformed by a later lithography process to form the negative resist pattern. The curing process includes thermal curing in one embodiment. The curing process may include ultraviolet (UV) curing, ion implant bombardment, e-beam treatment, or combinations thereof. The positive resist pattern 118 may alternatively or additionally be coated to protect and strengthen the positive resist features. For example, the positive resist pattern 118 may be coated by a polymeric material. For furtherance of the example, a BARC material is used to coat the positive resist features 118. The coated BARC layer may have a thickness ranging between about 50 angstroms and about 500 angstroms.

Thus the present disclosure provides a method of lithography patterning. The method includes forming a first resist pattern on a substrate, the first resist pattern including a plurality of openings therein on the substrate; forming a second resist pattern on the substrate and within the plurality of openings of the first resist pattern, the second resist pattern including at least one opening therein on the substrate; and removing the first resist pattern to uncover the substrate underlying the first resist pattern.

In the disclosed method, the first resist pattern may include a positive tone resist material and the second resist pattern comprises a negative tone resist material. The first resist pattern may include an etch rate higher than that of the second resist pattern in an etching process. The removing of the first resist pattern may include applying an etching process to selectively remove the first resist pattern relative to the second resist pattern. The removing of the first resist pattern may include applying a solvent to dissolve the first resist pattern. The removing of the first resist pattern may include applying a solvent in which the first resist pattern is soluble and the second resist pattern is insoluble. The method may further include etching the substrate within various openings of the second resist pattern after the removing of the first resist pattern. The etching of the substrate may include etching the substrate to form a plurality of contact holes in the substrate. The etching of the substrate may include etching the substrate to form a plurality of trenches in the substrate.

The present disclosure also provides another embodiment of a method of double patterning. The method includes forming a positive resist pattern on a substrate, the positive resist pattern including a plurality of positive resist features; forming a negative resist layer on the substrate and within openings defined by the plurality of positive resist features, wherein the positive resist pattern includes a top surface substantially free of the negative resist layer; exposing the negative resist layer, defining a plurality of unexposed negative resist features on the substrate; and applying a solvent to remove the positive resist pattern.

In this method, the applying of the solvent may include applying a developing solution to remove the positive resist features and the unexposed negative resist features. The forming of the negative resist layer may include applying a spin-on coating process. The applying of the spin-on coating process may include tuning spin speed to form the negative resist layer thinner than that of the positive resist pattern. The applying of the spin-on coating process may include coating a layer of negative resist with a tuned surface tension such that the negative resist layer is thinner than that of the positive resist pattern.

The present disclosure also provides another embodiment of a double patterning method. The method includes forming a positive resist pattern on a substrate; forming a negative resist layer on the substrate and the positive resist pattern; patterning the negative resist layer to form a negative resist pattern on the substrate; and applying an etching process to selectively remove the positive resist pattern, resulting in a plurality of openings defined by the negative resist pattern.

In various embodiments, the forming of the negative resist layer may include forming the negative resist layer with a top surface higher than that of the positive resist pattern. The forming of the negative resist layer may include forming the negative resist layer over the positive resist pattern with a corresponding thickness ranging between about 50 angstroms and about 100 angstroms. The substrate includes a semiconductor material layer. The substrate may further include a dielectric material layer formed on the semiconductor material layer. The method may further include etching the substrate through the plurality of openings defined by the negative resist pattern.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments disclosed herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
    forming a material layer on a substrate;
    forming a first resist pattern on the material layer, the first resist pattern including at least one opening;
    forming a second resist layer on the material layer within the at least one opening, wherein forming the second resist layer on the material layer within the at least one opening includes transferring a pattern from a mask onto the second resist layer;

removing a portion of the second resist layer to form a first opening in the second resist layer that uncovers the material layer underlying the second resist layer; and removing a portion of the first resist pattern to form a second opening in the second resist layer that uncovers the material layer underlying the first resist layer.

2. The method of claim 1, further comprising etching the material layer through at least one of the first and second openings of the second resist layer.

3. The method of claim 1, further comprising exposing the second resist layer to define a plurality of unexposed second resist layer features on the material layer.

4. The method of claim 3, wherein removing the portion of the first resist pattern to form a second opening includes applying a developing solution to remove the unexposed second resist layer features and to remove the portion of the first resist pattern.

5. The method of claim 1, wherein the first resist pattern comprises a positive tone resist material and the second resist layer comprises a negative tone resist material.

6. The method of claim 1, wherein the material layer is formed of a material selected from the group consisting of a dielectric material and a conductive material.

7. The method of claim 1, wherein removing the portion of the first resist pattern to form the second opening in the second resist layer includes applying a solvent in which the second resist layer is insoluble.

8. A method comprising:

forming a first resist pattern having an upper surface on a substrate, the first resist pattern including a plurality of openings therein on the substrate;

forming a second resist pattern having an upper surface on the substrate and within the plurality of openings of the first resist pattern such that the upper surface of the second resist pattern is lower than the upper surface of the first resist pattern, the second resist pattern including a first opening therein on the substrate; and removing the first resist pattern to uncover the substrate underlying the first resist pattern to form a second opening in the second resist pattern such that the second resist pattern includes the first and second openings that each uncover the substrate underlying the first resist pattern.

9. The method of claim 8, wherein the first resist pattern comprises a positive tone resist material and the second resist pattern comprises a negative tone resist material.

10. The method of claim 8, wherein the first resist pattern has an etch rate higher than that of the second resist pattern in an etching process.

11. The method of claim 8, wherein the removing of the first resist pattern comprises applying an etching process to selectively remove the first resist pattern relative to the second resist pattern.

12. The method of claim 8, further comprising etching the substrate within the first and second openings of the second resist pattern after the removing of the first resist pattern.

13. The method of claim 8, wherein forming the first resist pattern includes using a first mask in forming the first resist pattern, and wherein forming the second resist pattern includes using a second mask in forming the second resist pattern, the first mask being different than the second mask.

14. A method comprising:

forming a first resist pattern on a substrate;

forming a second resist layer on the substrate layer within at least one opening defined by the first resist pattern, wherein forming the second resist layer on the substrate layer within the at least one opening defined by the first resist pattern includes transferring a pattern from a mask onto the second resist layer;

removing a portion of the second resist layer to form a first opening in the second resist layer that uncovers the substrate underlying the second resist layer;

removing a portion of the first resist pattern to form a second opening in the second resist layer that uncovers the substrate underlying the first resist layer.

15. The method of claim 14, wherein forming the second resist layer on the substrate includes covering a portion of an upper surface of the first resist pattern.

16. The method of claim 14, wherein forming the second resist layer on the substrate includes forming the second resist layer on the substrate without covering an upper surface of the first resist pattern.

17. The method of claim 14, wherein removing the portion of the second resist layer and removing the portion of the first resist pattern occur during the same development process.

18. The method of claim 14, wherein the substrate includes a material layer formed thereon, and wherein forming the first resist pattern on the substrate includes forming the first resist pattern on the material layer.

19. The method of claim 18, wherein the material layer is one of a dielectric material layer and a conductive material layer.

20. The method of claim 14, further comprising etching the substrate through the first and second openings of the second resist layer.

* * * * *